US009257313B2

(12) United States Patent
Amano

(10) Patent No.: US 9,257,313 B2
(45) Date of Patent: *Feb. 9, 2016

(54) SUBSTRATE PROCESSING AND POSITIONING APPARATUS, SUBSTRATE PROCESSING AND POSITIONING METHOD AND STORAGE MEDIUM RECORDING PROGRAM FOR PROCESSING AND POSITIONING A SUBSTRATE

(75) Inventor: Yoshifumi Amano, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 1097 days.

This patent is subject to a terminal disclaimer.

(21) Appl. No.: 13/104,331

(22) Filed: May 10, 2011

(65) Prior Publication Data
US 2011/0281376 A1 Nov. 17, 2011

(30) Foreign Application Priority Data

May 12, 2010 (JP) .................................. 2010-110367
Mar. 16, 2011 (JP) .................................. 2011-058279

(51) Int. Cl.
*H01L 21/66* (2006.01)
*C23F 1/08* (2006.01)
*H01L 21/67* (2006.01)

(52) U.S. Cl.
CPC ...... *H01L 21/67051* (2013.01); *H01L 21/6708* (2013.01); *H01L 21/67253* (2013.01)

(58) Field of Classification Search
CPC .................. H01L 21/67051; H01L 21/67253; H01L 21/670851; H01L 21/67046; H01L 21/68
USPC ........................................................... 700/5
See application file for complete search history.

(56) References Cited

U.S. PATENT DOCUMENTS 6,032,512 A * 3/2000 Li ........................... H01L 21/68
73/1.79
6,327,512 B1 * 12/2001 Hirata et al. ................... 700/114

(Continued)

FOREIGN PATENT DOCUMENTS

JP 2002-176093 A 6/2002
JP 2004-342939 A 12/2004

(Continued)

OTHER PUBLICATIONS

Amano et al, "Substrate Cleaning Apparatus and Substrate cleaning method" (Machine Translation of patent JP 2009-147152), Jul. 2, 2009, pp. 20.*

*Primary Examiner* — Carlos Ortiz Rodriguez
*Assistant Examiner* — Olvin Lopez Alvarez
(74) *Attorney, Agent, or Firm* — Abelman, Frayne & Schwab

(57) ABSTRACT

Disclosed is a substrate processing apparatus including: a substrate processing unit that performs substrate processing by supplying a processing liquid to a substrate to be processed; a positioning mechanism that contacts the sides of the substrate to determine the position of the substrate; a positioning driver that drives the positioning mechanism; a detector that detects the position of the positioning mechanism; a storage unit that stores the position of the positioning mechanism with respect to a reference substrate serving as a reference of the substrate as a reference position information; and an operator that calculates a difference between the reference position information and the position information of the positioning mechanism detected in the detector and calculates measurement information on the processed substrate based on the difference.

14 Claims, 8 Drawing Sheets

(56) References Cited

U.S. PATENT DOCUMENTS

| | | | |
|---|---|---|---|
| 6,382,849 B1* | 5/2002 | Sakamoto et al. | 396/611 |
| 6,857,838 B2* | 2/2005 | Kuroda | 414/331.01 |
| 6,867,110 B2* | 3/2005 | Yanagita et al. | 438/459 |
| 7,153,087 B2* | 12/2006 | Kang et al. | 414/781 |
| 7,499,767 B2* | 3/2009 | Kurita et al. | 700/218 |
| 7,622,006 B2* | 11/2009 | Ishizawa et al. | 118/719 |
| 8,025,475 B2* | 9/2011 | Wakabayashi | 414/744.5 |
| 8,123,901 B2* | 2/2012 | Inada et al. | 156/345.24 |
| 8,136,564 B2* | 3/2012 | Nakamura et al. | 156/381 |
| 8,231,285 B2* | 7/2012 | Ogata et al. | 396/611 |
| 8,550,470 B2* | 10/2013 | Amano et al. | 279/3 |
| 8,617,318 B2* | 12/2013 | Amano et al. | 134/32 |
| 2001/0039117 A1* | 11/2001 | Ito | B05D 1/005 438/689 |
| 2001/0043813 A1* | 11/2001 | Kitamura | 396/564 |
| 2003/0168175 A1* | 9/2003 | Kim et al. | 156/345.51 |
| 2005/0150451 A1* | 7/2005 | Tanaka | H01L 21/6715 118/688 |
| 2005/0183822 A1* | 8/2005 | Ono et al. | 156/345.28 |
| 2006/0048792 A1* | 3/2006 | Nakamura et al. | 134/2 |
| 2006/0102289 A1* | 5/2006 | Fukatsu et al. | 156/345.55 |
| 2006/0208749 A1* | 9/2006 | Otaguro et al. | 324/758 |
| 2007/0082134 A1* | 4/2007 | Fukuda et al. | 427/337 |
| 2007/0234585 A1* | 10/2007 | Lim et al. | 33/645 |
| 2007/0276533 A1* | 11/2007 | Machiyama | 700/121 |
| 2008/0081110 A1* | 4/2008 | Winter | 427/240 |
| 2008/0112780 A1* | 5/2008 | Matano et al. | 414/217.1 |
| 2008/0115728 A1* | 5/2008 | Matsuda | H01J 37/32009 118/723 R |
| 2008/0206024 A1* | 8/2008 | Buitron et al. | 414/226.01 |
| 2008/0226830 A1* | 9/2008 | Miyagi | H01L 21/6708 427/402 |
| 2009/0017733 A1* | 1/2009 | Takahashi et al. | 451/57 |
| 2009/0033898 A1* | 2/2009 | Yamamoto et al. | 355/53 |
| 2009/0087559 A1* | 4/2009 | Yoshihara et al. | 427/240 |
| 2009/0303272 A1* | 12/2009 | Jung | 347/14 |
| 2010/0008688 A1* | 1/2010 | Kimura | 399/66 |
| 2010/0009274 A1* | 1/2010 | Yamamoto | 430/30 |
| 2010/0104380 A1* | 4/2010 | Toda et al. | 406/12 |
| 2010/0130022 A1* | 5/2010 | Park | H01L 21/67178 438/758 |
| 2011/0048469 A1* | 3/2011 | Ogata et al. | 134/33 |
| 2011/0282484 A1* | 11/2011 | Amano | 700/114 |
| 2013/0206726 A1* | 8/2013 | Oono | 216/85 |

FOREIGN PATENT DOCUMENTS

| | | | | |
|---|---|---|---|---|
| JP | 2005203440 | * | 7/2005 | H01L 21/027 |
| JP | 2006237063 | * | 9/2006 | H01L 21/304 |
| JP | 2007-142077 A | | 6/2007 | |
| JP | 2007142077 | * | 6/2007 | H01L 21/027 |
| JP | 2009-130011 A | | 6/2009 | |
| JP | 2009-147152 A | | 7/2009 | |
| TW | 200823966 A | | 6/2008 | |

* cited by examiner

SUBSTRATE PROCESSING AND POSITIONING APPARATUS, SUBSTRATE PROCESSING AND POSITIONING METHOD AND STORAGE MEDIUM RECORDING PROGRAM FOR PROCESSING AND POSITIONING A SUBSTRATE

CROSS-REFERENCE TO RELATED APPLICATIONS

This application is based on and claims priority from Japanese Patent Application Nos. 2010-110367 and 2011-058279, filed on May 12, 2010 and Mar. 16, 2011, respectively, with the Japanese Patent Office, the disclosures of which are incorporated herein in their entireties by reference.

TECHNICAL FIELD

The present disclosure relates to a substrate processing apparatus, a substrate processing method, and a storage medium recording a program.

BACKGROUND

A semiconductor device, such as a semiconductor memory, is formed by performing a substrate processing, such as depositing, etching, on a substrate, such as a semiconductor wafer. An example of the substrate processing may include a bevel processing performed on a peripheral portion of the substrate, and the bevel processing is performed by a substrate processing apparatus that performs the bevel processing.

The bevel processing is performed while rotating the substrate, such as the semiconductor wafer, and therefore, the center of the substrate needs to be coincided with the rotating center, and as a result, it is important to determine the position of the substrate such as the semiconductor wafer subjected to the bevel processing. The reason is that the bevel processing is performed within a range of several millimeters from a side (end) of the substrate. Therefore, when the substrate is positioned deviated from a predetermined position in a substrate processing apparatus, the desired bevel processing may not be performed, which causes, for example, a reduction in a manufacturing yield of the semiconductor device.

Further, in addition to the substrate processing apparatus that performs the bevel processing, an apparatus performing processing toward the surroundings of the substrate from the center of the substrate, and an apparatus performing the processing toward the center of the substrate from the surroundings of the substrate require an accurate positioning of the center of the substrate to the rotating center.

As some examples, Japanese Patent Application Laid-Open Nos. 2007-142077 and 2009-147152 disclose an apparatus performing the substrate processing of a specific area while rotating the substrate.

SUMMARY

An exemplary embodiment of the present disclosure provides a substrate processing apparatus, including: a substrate processing unit that performs a substrate processing while supplying a processing liquid to a substrate to be processed; a positioning mechanism that contacts the side of the substrate to determine the position of the substrate; a positioning driver that drives the positioning mechanism; a detector that detects the position of the positioning mechanism; a storage unit that stores the position of the positioning mechanism for a reference substrate that is the reference of the substrate as a reference position information; and an operator that calculates the difference between the reference position information and the position information of the positioning mechanism detected in the detector and calculates measurement information on the substrate based on the difference.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
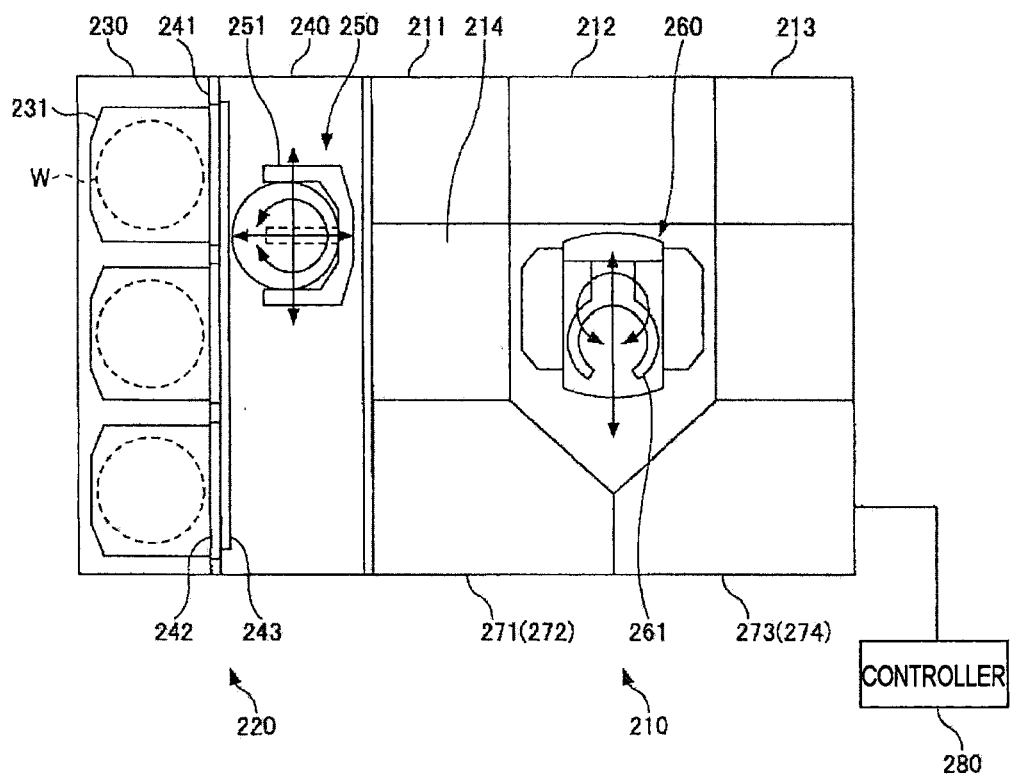
FIG. 1 is a transversal cross-sectional view of a substrate processing system according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The positioning of the center of the substrate with respect to the rotation center in the substrate processing apparatus disclosed in Japanese Patent Applications Laid-Open Nos. 2007-142077 and 2009-147152 may be insufficient. In this case, for example, a yield may be degraded as described above. Considering the manufacturing error or the manufacturing situation of the semiconductor wafer, it is difficult to manufacture the semiconductor wafer having the exactly same diameter, and even in the case of the same 300 mm wafer, the semiconductor wafers having different sizes are generally supplied within a range satisfying a predetermined standard. In particular, in the case of a large substrate such as 300 mm wafer, it may be difficult to accurately determine the position of the center of the substrate with respect to the rotating center.

Therefore, even in substrates such as semiconductor wafers having different sizes, a substrate processing apparatus, a substrate processing method, and a storage medium recording a program are required which are capable of more precisely processing the substrate by accurately measuring the size of a substrate and transferring the measured information to a processing unit.

According to an embodiment of the present disclosure, a substrate processing apparatus is provided including: a substrate processing unit that performs a substrate processing by supplying a processing liquid to a substrate to be processed; a positioning mechanism that contacts the side of the substrate to determine the position of the substrate; a positioning driver that drives the positioning mechanism; a detector that detects the position of the positioning mechanism; a storage unit that stores the position of the positioning mechanism with respect to a reference substrate serving as a reference of the substrate as a reference position information; and an operator that calculates a difference between the reference position information and the position information of the positioning mechanism detected in the detector and calculates the measurement information on the substrate based on the difference.

The substrate processing apparatus described above further includes a transmitter that transmits the measurement information calculated in the operator to the substrate processing unit. Also, the transmitter described above transmits the measurement information to a plurality of substrate processing units.

In the substrate processing apparatus described above, the substrate processing unit further includes: a nozzle to supply a liquid that performs the processing of the substrate; a nozzle driver to move the nozzle along the surface of the substrate; and a nozzle driving controller that controls the nozzle driver so as to move the nozzle to a predetermined position based on the information of the operator.

In the substrate processing apparatus described above, the nozzle supplies a processing liquid to the bevel part of the processed substrate to perform a bevel processing. And the nozzle moves from the central portion of the substrate to the peripheral portions thereof or from the peripheral portions of the substrate to the central portion thereof.

The substrate processing apparatus described above further includes a positioning driving controller that controls the positioning driver to drive the positioning driver based on the information of the operator so as to move the substrate to a predetermined position. And the measurement information is information on the diameter of the substrate.

In the substrate processing apparatus described above, the substrate processing unit and the positioning mechanism may be mounted in different units or a single unit.

In the substrate processing apparatus described above, the positioning mechanism further includes: a first positioning mechanism including a first reference part that contacts the one side of the substrate and a first driver that moves the first reference part; and a second positioning mechanism including a second reference part that contacts the other side of the substrate and a second driver that moves the second reference part.

In the substrate processing apparatus described above, the first reference part is formed to contact with the one side of the substrate at two or more points, and the second reference part is formed to include a contact part that contacts the other side of the substrate at one point and an elastic part that may apply force to the contact part in a moving direction of the second reference part. Further, the contact part has a substantially circular shape and is mounted in the second reference part in a rotatable state around the center of the circular shape as an axis.

According to another embodiment of the present disclosure, a substrate processing method is provided that performs a substrate processing by supplying a processing liquid to a substrate to be processed. The substrate processing method includes: storing information for a reference substrate; disposing the substrate on a substrate disposing part; detecting the position of the positioning mechanism by contacting the substrate with a positioning mechanism; and calculating measurement information for the substrate based on a position information detected in the detecting and information for the reference substrate.

The substrate processing method described above further includes transmitting the measurement information of the substrate to a substrate processing unit. And, the substrate processing is performed by moving a nozzle in the substrate processing unit to a predetermined position based on the measurement information of the substrate received during the transmitting and by supplying the processing liquid from the nozzle.

In the substrate processing method described above, the storing of the reference substrate information further includes: disposing the reference substrate on the substrate disposing part so that the center of the reference substrate coincides with the center of the substrate disposing part; determining a reference position of the positioning mechanism by contacting the first reference part with the one side of the reference substrate and contacting the second reference part with the other side of the reference substrate; and storing the reference position as the information for the reference substrate.

In the substrate processing method described above, the detecting detects the position of the second reference part by the detector by contacting the first reference part with the one side of the processed substrate and contacting the second reference part with the other side of the processed substrate. Further, the calculating calculates the diameter of the substrate based on the value detected in the detecting and information for the reference substrate.

In the substrate processing method described above, the positioning of a plurality of processed substrates may be performed by repeatedly performing the disposing of the substrate, the detecting, and the calculating.

According to yet another embodiment of the present disclosure, a computer readable storage medium is provided recording programs in a computer for executing the substrate processing method described above.

According to the exemplary embodiments of the present disclosures, even in the substrate such as the semiconductor wafer having different sizes, the substrate processing apparatus, the substrate processing method, and the storage medium recording programs may be provided which are capable of more precisely processing the substrate by accurately measuring the size of the substrate and transferring the measured information to the processing unit.

Exemplary embodiments of the present disclosure will be described below.

Substrate Processing System

A substrate processing system according to an exemplary embodiment of the present disclosure will be described.

Figure 2:
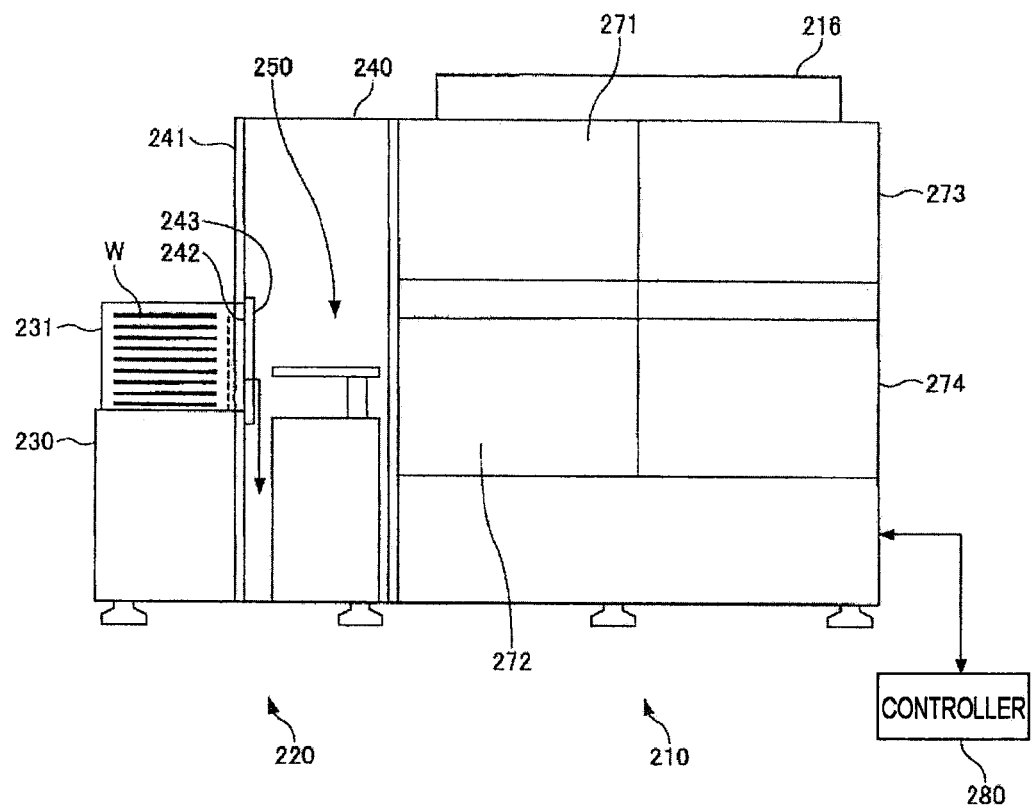
FIG. 2 is a side view of the substrate processing system according to the exemplary embodiment of the present disclosure.

The substrate processing system according to the exemplary embodiment of the present disclosure will be described with reference to FIGS. 1 and 2. In addition, FIG. 1 is a transversal cross-sectional view of the substrate processing system, and FIG. 2 is a side view thereof. The substrate processing system is configured to include a substrate processing part 210 performing a substrate processing, and a carrying in and out part 220 that carries in and out a wafer W between the outside and substrate processing part 210.

Carrying in and out part 220 is provided with a placing table 230 disposing a front opening unified pod (FOUP) 231 capable of housing multiple sheets of wafers, for example, twenty-five (25) sheets of wafers, and a carrying chamber 240 transferring wafer W between FOUP 231 disposed on placing table 230, and substrate processing part 210. Multiple sheets of wafers W are received in FOUP 231 in a substantially horizontal state and stored in a vertical direction at a predetermined interval.

Placing table 230 is disposed along a side wall portion 241 of carrying chamber 240 and, for example, three (3) FOUPs 231 are disposed at predetermined positions. Side wall portion 241 has opening parts 242 disposed at positions corresponding to disposition points of each FOUP 231, and wafer W is carried in and out between carrying chamber 240 and FOUP 231 by opening and closing a shutter 243 installed on each opening part 242. A first wafer carrying mechanism 250 carrying wafer W between FOUP 231 and substrate processing part 210 is installed within carrying chamber 240. First wafer carrying mechanism 250 includes a pick 251 configured to be able to advance and retreat, elevated, and rotated. Wafer W is carried while being maintained on pick 251. In addition, pick 251 may enter into a wafer transfer unit 214 installed on substrate processing part 210, such that wafer W may be transferred between carrying chamber 240 and substrate processing part 210 by entering pick 251 into wafer transfer unit 214.

Substrate processing part 210 is provided with wafer transfer unit 214 temporarily disposing wafer W transferred between substrate processing part 210 and carrying chamber 240, substrate processing units 271 to 274 performing the substrate processing on wafer W, and second wafer carrying mechanism 260 carrying wafer W within substrate processing part 210. In addition, the substrate positioning apparatus and the substrate processing apparatus such as the bevel processing apparatus according to the exemplary embodiment of the present disclosure is incorporated in any one of substrate processing units 271 to 274. In addition, second wafer carrying mechanism 260 includes a pick 261 configured to be able to advance and retreat, elevated, and rotated. Wafer W is carried while being maintained on pick 261. Further, substrate processing part 210 is provided with a processing liquid storing unit 211 storing a processing liquid that performs, for example, the bevel processing, a power supply unit 212 that supplies power to the entire substrate processing system, and a mechanical control unit 213 that performs the control of the entire substrate processing system. In addition, the ceiling portion of substrate processing part 210 is provided with a fan filter unit (FFU) 216 that supplies a clean air by a down flow to each unit and a space in which second wafer carrying mechanism 260 is mounted.

Further, the substrate processing system is connected to a controller 280. Controller 280 is configured by a computer including, for example, a CPU (not shown) and a storage unit (not shown), and the storage unit is stored with programs controlling operations performed in the substrate processing system. These programs are stored in a storage medium such as a hard disk, a compact disk, a magnet optical disk, a memory card, etc., and are installed in a computer therefrom. In addition, controller 280 may be installed in, for example, mechanical control unit 213 in substrate processing part 210.

Further, the substrate processing system according to the exemplary embodiment has a plurality of processing units, but is included in the concept of a substrate processing apparatus.

Substrate Processing Apparatus

Next, the substrate processing apparatus according to the exemplary embodiment of the present disclosure, which performs the processing on the wafer W will be described. The substrate processing apparatus according to the exemplary embodiment of the present disclosure may be incorporated into any one of substrate processing units 271 to 274 in the above-described substrate processing system.

The substrate processing apparatus is, for example, the bevel processing apparatus performing the bevel processing on the substrate. Specifically, the bevel processing apparatus is an apparatus performing the processing on an area up to about 3 mm inwardly from a side (end) of wafer W while rotating wafer W. The bevel processing apparatus is also the substrate processing apparatus that removes, for example, an $SiO_2$ layer, an $SiN$ layer, a polysilicone layer, which are formed on the area, by using a processing liquid such as a mixing solution of hydrofluoric acid (HF), ammonia ($NH_3$), and hydrogen peroxide ($H_2O_2$) and a processing liquid such as nitrohydrofluoric acid (a mixing solution of hydrofluoric acid and nitric acid ($HNO_3$)). In addition, wafer W described above according to the exemplary embodiment of the present disclosure corresponds to a substrate 30 to be described below and is referred to as a semiconductor wafer.

Figure 3:
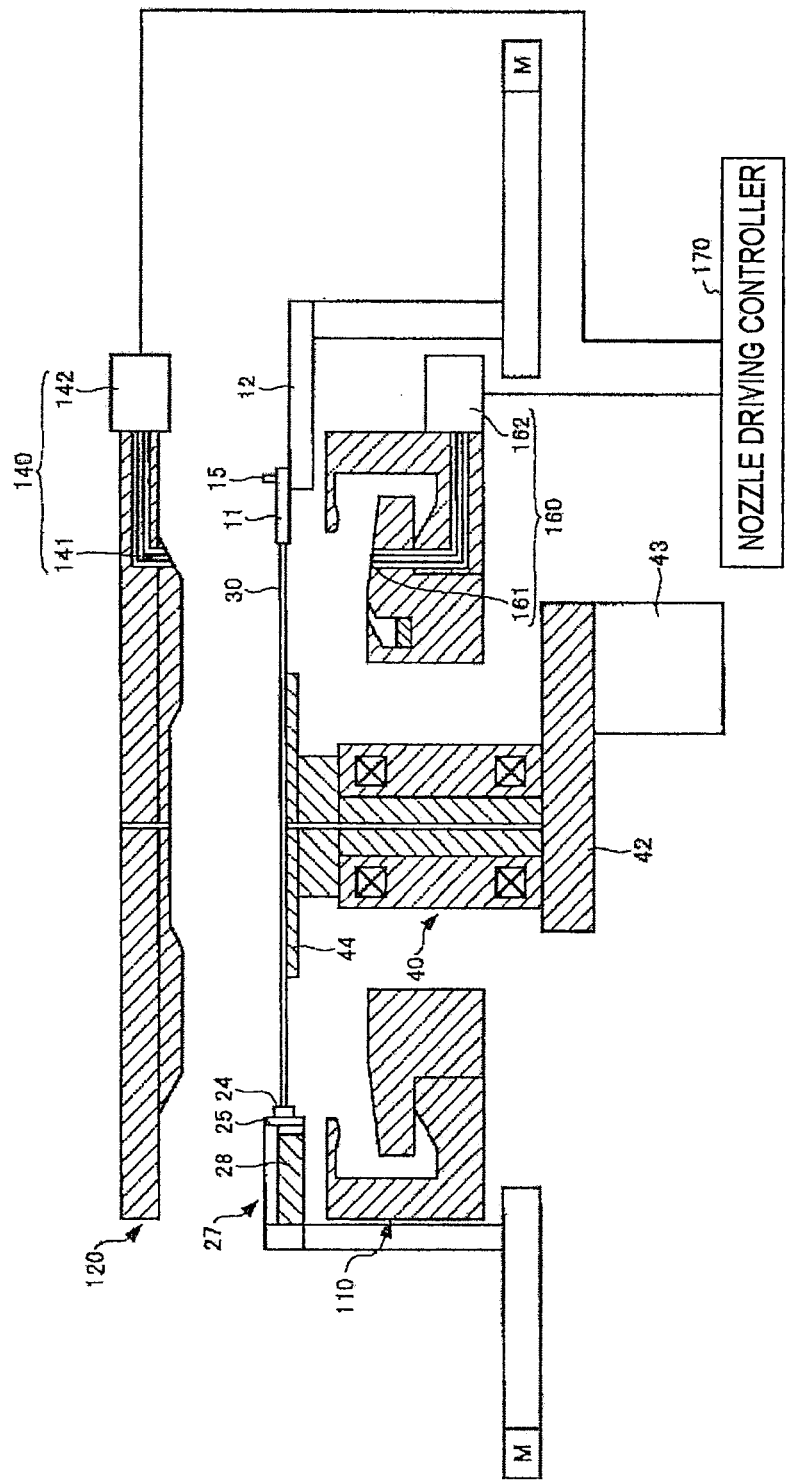
FIG. 3 is a diagram (1) illustrating a bevel processing apparatus according to the exemplary embodiment of the present disclosure.
Figure 4:
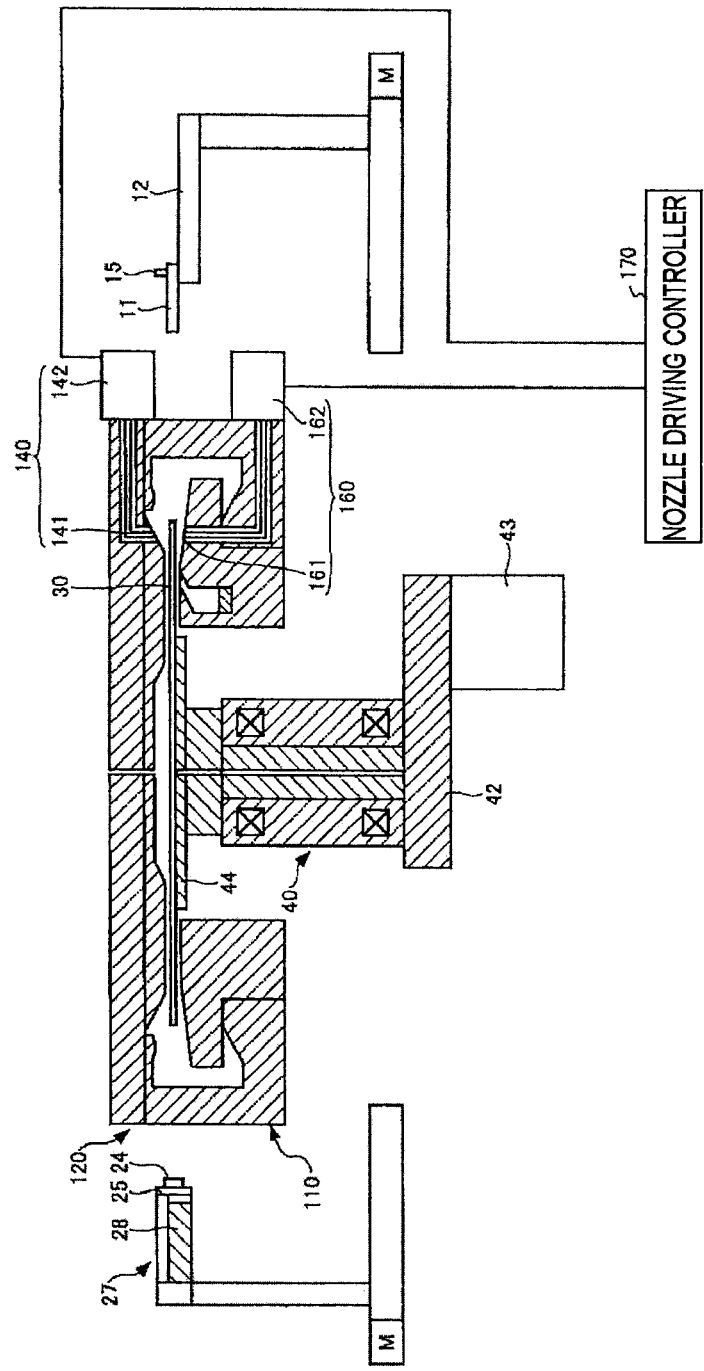
FIG. 4 is a diagram (2) illustrating the bevel processing apparatus according to the exemplary embodiment of the present disclosure.

The bevel processing apparatus will be described with reference to FIGS. 3 and 4 as a substrate processing apparatus according to the exemplary embodiment of the present disclosure. The bevel processing apparatus includes a drain cup 110 that receives the processing liquid used in the bevel processing and exhausts the processing liquid to outside, a top plate 120 that covers the top side of the substrate, a rotating part 40 rotating substrate 30 which is disposed thereon, nozzle parts 140 and 160, and a brush unit 150 shown in FIG. 5, and further includes the substrate positioning apparatus to be described below. FIG. 3 shows a state in which a drain cup 110 and a top plate 120 are opened, and the substrate may be carrying out and in. And FIG. 4 shows a state in which drain cup 110 and top plate 120 are closed. In addition, the bevel processing is performed in a state where drain cup 110 and top plate 120 are closed as shown in FIG. 4.

Figure 6:
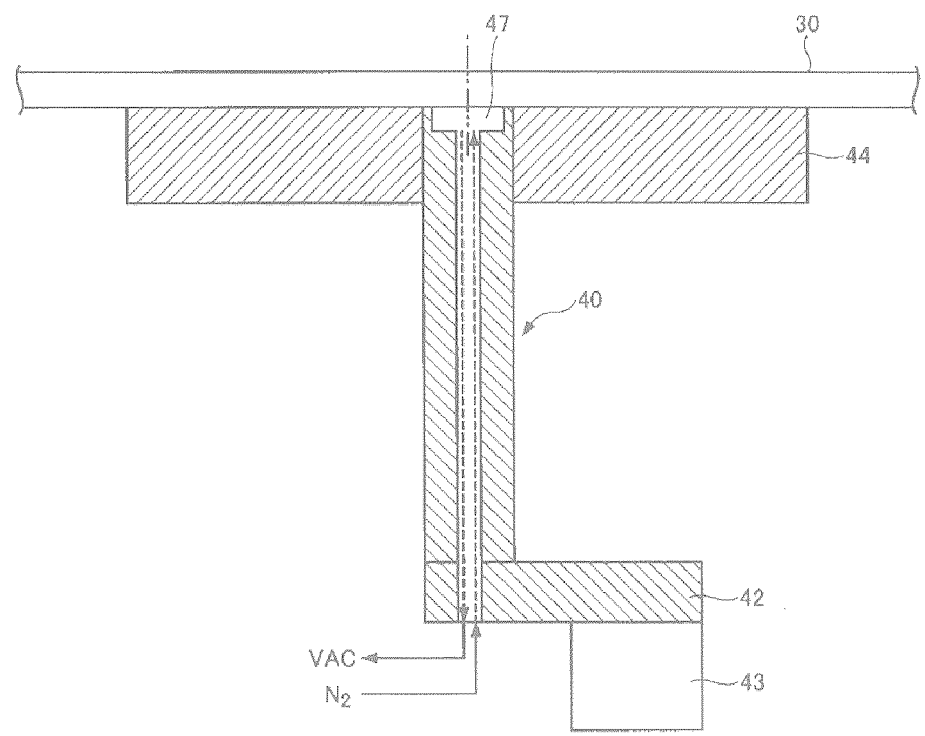
FIG. 6 is a cross sectional view of a rotating part and a vacuum chuck part.

As shown in FIG. 6, rotating part 40 is provided with a motor 43 via a rotating transfer part 42 to rotate substrate 30 disposed thereon. In addition, a surface of rotating part 40 disposed with substrate 30 is provided with a vacuum chuck part 44. Vacuum chuck part 44 is a substrate adsorption part and is connected to, for example, a vacuum pump (not shown). Vacuum chuck part 44 is provided with a gas opening part 47. After substrate 30 is disposed on vacuum chuck part 44, the gas is evacuated by, for example, the vacuum pump. Thus, substrate 30 is adsorbed at gas opening part 47. In addition, vacuum chuck part 44 supplies, for example, nitrogen ($N_2$) gas to substrate 30 side from a gas opening part 47 (nitrogen gas blow), such that substrate 30 may be floated over vacuum chuck part 44.

In the exemplary embodiment of the present disclosure, after substrate 30 is disposed on vacuum chuck part 44 of rotating part 40, the central position of substrate 30 is determined by the substrate positioning apparatus to be described below provided at the outside of drain cup 110 that enters into between drain cup 110 and top plate 120. Thereafter, the substrate positioning apparatus is retreated to the outside from the entered point between drain cup 110 and top plate 120, and then, the processing space is formed in a state that top plate 120 moves down and drain cup 110 moves up to contact top plate 120 and drain cup 110. In the processing space, substrate 30 rotates to supply the processing liquid from a first nozzle 141 of nozzle part 140 mounted at top plate 120 side, and a second nozzle 161 of nozzle part 160 mounted at drain cup 110 side, thereby performing the bevel processing on substrate 30.

In this case, nozzle part 140 is provided with a motor 142 for moving first nozzle 141 in a radial direction of substrate 30, and nozzle part 160 is provided with a motor 162 for moving second nozzle 161 in a radial direction of substrate 30. First nozzle 141 and second nozzle 161 may be disposed at a position by motors 142 and 162, and the position is based on the information on the diameter of substrate 30 obtained by the substrate positioning apparatus to be described below. In this case, motors 142 and 162 that serve as the nozzle driver move first nozzle 141 and second nozzle 161 by the control of nozzle driving controller 170. Therefore, the desired bevel processing may be ensured to be performed regardless of the size of the substrate.

In addition, drain cup 110 may be provided with a nozzle part (not shown) and may be provided with a plurality of nozzle parts, in addition to nozzle part 140. These nozzle parts have an approximately same configuration as nozzle part 140, and may be provided with a nozzle and a motor for the nozzle for moving the nozzle in the radial direction of substrate 30.

Figure 5:
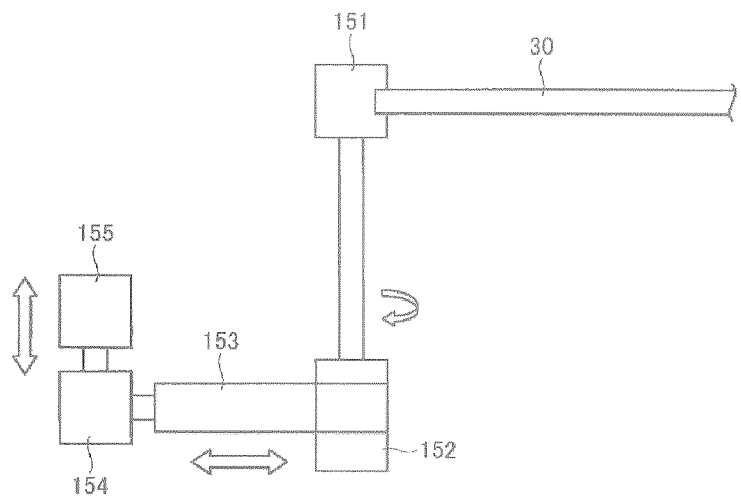
FIG. 5 is a configuration diagram of a brush unit.

Further, as shown in FIG. 5, the substrate processing apparatus according to the exemplary embodiment of the present disclosure includes a brush unit 150 and may perform the processing by brush unit 150. Brush unit 150 includes a brush part 151 made of, for example, a cylindrical sponge, which performs the processing by contacting substrate 30, a motor 152 for a brush for rotating brush part 151, and a first motor 154 and a second motor 155 capable of moving a brush unit body part 153 including brush part 151 and motor 152 for a brush. Further, brush unit 150 performs the processing on substrate 30 in a state that drain cup 110 and top plate 120 are closed. First motor 154 may move brush unit body part 153 in a parallel direction to the surface of substrate 30 and may control the position of brush part 151 with respect to substrate 30. Therefore, the area in which the bevel processing of substrate 30 is performed by first motor 154 may be defined. In addition, second motor 155 may move brush unit body part 153 in a vertical direction to the surface of substrate 30 and may control the height of brush part 151 with respect to substrate 30. Therefore, brush part 151 may be controlled to a height by second motor 155, at which the processing of substrate 30 is performed with a desired compression force. In the exemplary embodiment of the present disclosure, brush part 151 may move to the desired position corresponding to the size of substrate 30 by controlling first motor 154, based on the information on, for example, the diameter of substrate 30 obtained according to the substrate positioning apparatus to be described below. Therefore, the processing of substrate 30 may be performed at the optimal position by brush part 151, thereby performing the desired processing.

Substrate Positioning Apparatus

Next, the substrate positioning apparatus according to the exemplary embodiment of the present disclosure will be described.

Figure 7:
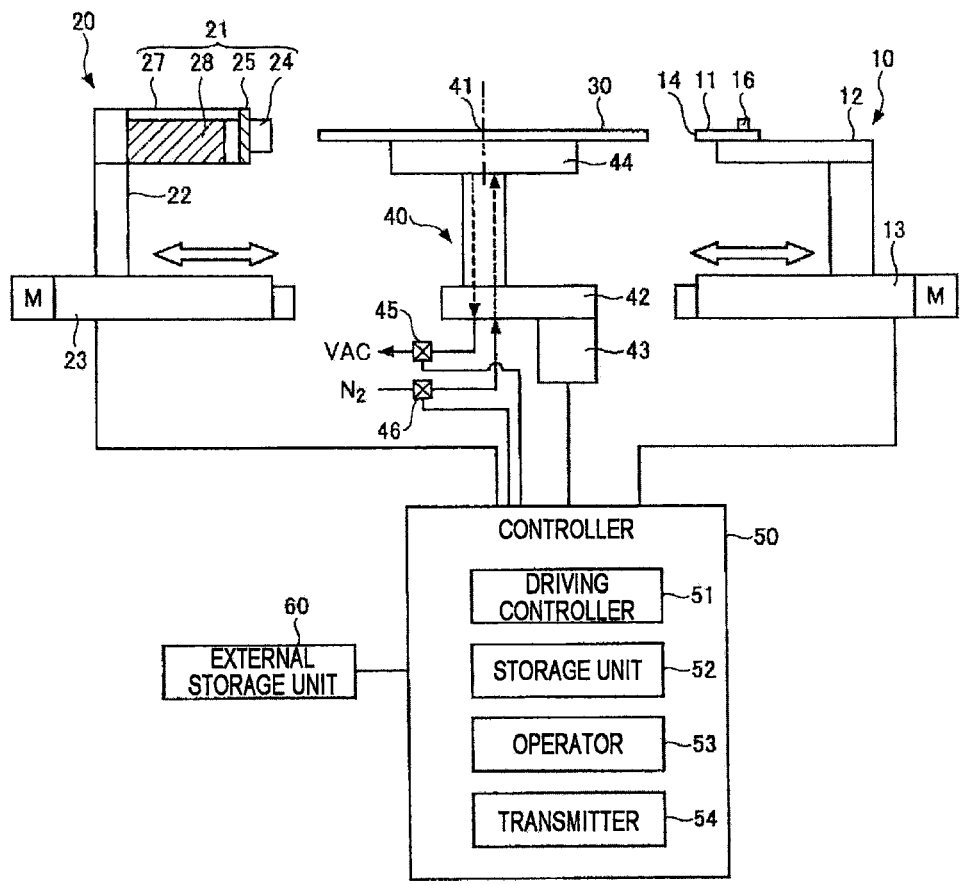
FIG. 7 is a side view of a substrate positioning apparatus according to the exemplary embodiment of the present disclosure.
Figure 8:
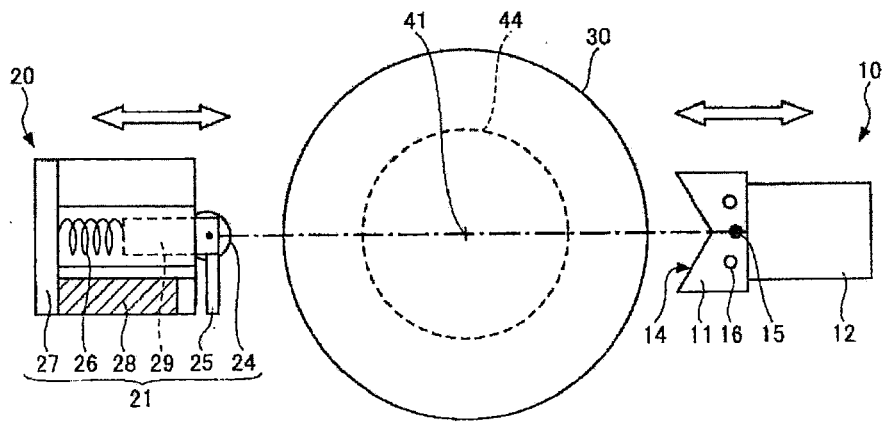
FIG. 8 is a plan view of the substrate positioning apparatus according to the exemplary embodiment of the present disclosure.

FIG. 7 is a side view of the substrate positioning apparatus according to the exemplary embodiment of the present disclosure, and FIG. 8 is a plan view of the substrate positioning apparatus according to the exemplary embodiment of the present disclosure. The substrate positioning apparatus performs the positioning of a circular-shape substrate such as a semiconductor wafer.

The substrate positioning apparatus according to the exemplary embodiment of the present disclosure may be incorporated in any one of substrate processing units 271 to 274, and includes a first positioning mechanism 10 and a second positioning mechanism 20. First positioning mechanism 10 and second positioning mechanism 20 are disposed at a position opposite to each other across rotating part 40 is a straight line passing through a rotating center 41 of rotating part 40 mounting substrate 30.

First positioning mechanism 10 includes a first reference part 11 contacting a side (end) of substrate 30, a support part 12 supporting first reference part 11, and a first driver 13 linearly moving first reference part 11 in the radial direction of substrate 30 through support part 12. First reference part 11 is formed so that a contact surface 14 contacting substrate 30 is formed in a V-shape, when seen from above, and may contact two points of the side of circular substrate 30 on contact surface 14. First reference part 11 may be made of a material that is not deformed, that is, a material such as metal having a relatively lower possibility to incorporate impurities. For example, ceramics or a resin material such as polyether, ether, and ketone resin (PEEK) may be used. Support part 12 is formed in an L-shape and one end thereof is attached with first reference part 11. First reference part 11 is rotatably supported along with a pin 15 mounted on support part 12 and is fixed by a screw 16.

In this case, first reference part 11 moves around pin 15 to be fixed by screw 16 at a position contacting the side of, for example, a reference substrate 81 to be described below, such that first reference part 11 and reference substrate 81 may be ensured to be contacted at two points. In addition, the other end of support part 12 is connected to first driving part 13. First driver 13 may linearly move first reference part 11 in the radial direction of substrate 30, and is constituted with a motor performing a position control so as to stop first reference part 11 at a predetermined position. For example, an example of the motor may include a stepping motor that may relatively accurately perform the position control.

Second positioning mechanism 20 includes a second reference part 21 contacting the other side of substrate 30, a support part 22 supporting second reference part 21, and a second driver 23 linearly moving second reference part 21 in the radial direction of substrate 30 through support part 22.

In addition, second reference part 21 includes a contact part 24, a movable part 25, a spring part 26, a body part 27, a position sensor 28, and a connecting part 29.

Contact part 24 is formed in a cylindrical shape and is attached to connecting part 29 in a state in which contact part 24 may rotate around the center of the cylindrical shape contact part 24 as an axis. For example, contact part 24 may be configured with, for example, a ball bearing. Connecting part 29 is connected to body part 27 through spring part 26, and spring part 26 is attached so that contact part 24 attached to connecting part 29 applies force in a direction toward rotating center 41 of rotating part 40. For this reason, when contacting the side of substrate 30 at the side of contact part 24, even though the center of substrate 30 is deviated from the straight line connecting contact part 24 and rotating center 41 of rotating part 40, substrate 30 may smoothly move by rotating contact part 24 according to the movement of substrate 30. In addition, when contacting the side of substrate 30 at the side of contact part 24, spring part 26 is retracted, thereby preventing a force more than required from being applied to substrate 30. Movable part 25 is connected to connecting part 29, and moves together with contact part 24 moving according to extension and contraction of spring part 26. In addition, position sensor 28 attached to body part 27 is able to measure a distance up to movable part 25. As described above, the diameter of substrate 30 may be calculated by measuring the distance up to movable part 25 by position sensor 28 and obtaining the difference from a predetermined reference distance. Contact part 24 may be made of a material that is not deformed, that is, a material such as metal having a lower possibility of allowing impurities to be incorporated therein. For example, ceramics or a resin material such as polyether, ether, ketone resin (PEEK) may be used. In addition, as position sensor 28, any position sensor that may detect the position of movable part 25 may be used, for example, a contact type sensor, and a non-contact type sensor such as a magnetic sensor or an optical sensor.

Second reference part 21 is connected to one end of support part 22 and the other end of support part 22 is connected to second driver 23. Second driver 23 may linearly move second reference part 21 in the radial direction of substrate 30. For example, second driver 23 may be formed with, for example, a linearly movable air cylinder or a linearly movable motor. Further, the linear moving direction of first driver 13 and the linear moving direction of second driver 23 are situated on the same line and rotating center 41 of rotating part 40 is present on the line. In addition, second driver 23 is connected to an elevation cylinder (not shown) that is movable in a vertical direction with respect to the surface of substrate 30, and may move all of second reference part 21, support part 22, and second driver 23 in a substantially vertical direction with respect to the surface of substrate 30.

Further, in the exemplary embodiment of the present disclosure, first reference part 11 of first positioning mechanism 10, rotating center 41 of rotating part 40, and second reference part 21 of second positioning mechanism 20 are disposed on the same line.

Furthermore, in the exemplary embodiment of the present disclosure, first positioning mechanism 10, second positioning mechanism 20, rotating part 40, a vacuum pump (not shown) that vacuum-chucks substrate 30 in vacuum chuck part 44, a valve 45 that switches the connecting state of vacuum pump and vacuum chuck part 44, and a valve 46 that supplies, for example, nitrogen gas, are connected to a controller 50 which may control all of the above-described components. In addition, controller 50 is connected to an external storage unit 60, which stores programs to allow controller 50 being used for performing control operation of controller 50. Further, controller 50 includes a driving controller 51 controlling, for example, first positioning mechanism 10, second positioning mechanism 20, rotating part 40, a storage unit 52 storing information regarding, for example, a reference position, an operator 53 performing various calculating operations, and a transmitter 54 transmitting information of the measured substrate to a substrate processing part that actually performs the processing for the substrate.

Substrate Measuring and Positioning Method

Figure 9:
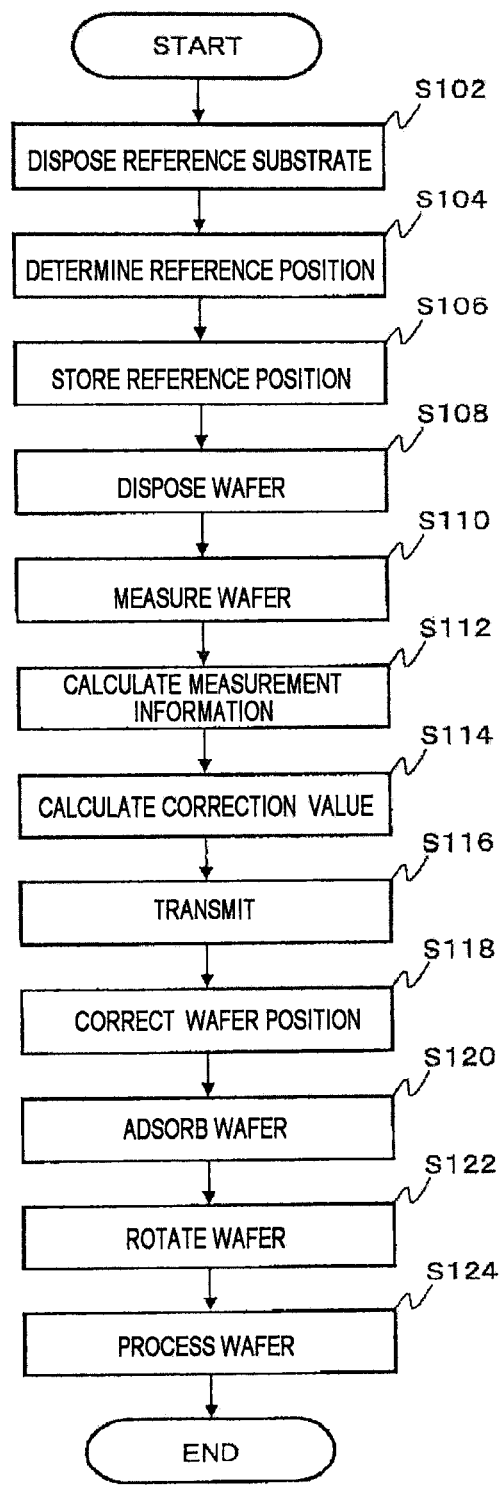
FIG. 9 is a flow chart of a substrate positioning method according to another exemplary embodiment of the present disclosure.

Next, a substrate measuring and positioning method according to the exemplary embodiment of the present disclosure will be described with reference to FIG. 9. The substrate measuring and positioning method is performed using the substrate processing apparatus and substrate positioning apparatus according to the exemplary embodiment.

Figure 10:
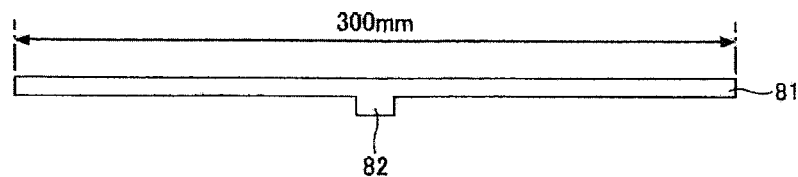
FIG. 10 is a diagram illustrating a reference substrate.

First, at S102, the reference substrate is disposed on vacuum chuck part 44 of rotating part 40. Specifically, as shown in FIG. 10, a reference substrate 81 is formed in a circular-shape having a diameter of 300 mm and the central portion of reference substrate 81 is provided with a convex portion 82. In addition, a portion which is rotating center 41 of the surface of vacuum chuck part 44 is provided with a concave portion (not shown) to insert corresponding convex portion 82 of reference substrate 81 into the concave portion of vacuum chuck part 44, such that rotating center 41 of rotating part 40 coincides with the center of reference substrate 81. That is, in reference substrate 81, the distance from rotating center 41 of rotating part 40 to the peripheral portion thereof is set to be uniform. In addition, although the exemplary embodiment of the present disclosure discloses a configuration in which the central portion of reference substrate 81 is provided with convex portion 82, and vacuum chuck part 44 is provided with the concave portion, any shape and method may be used as long as reference substrate 81 can be mounted on vacuum chuck part 44 so that rotating center 41 of rotating part 40 is coincided with the center of reference substrate 81.

Next, at S104, the determination of the reference position is performed. Specifically, the reference positions of first positioning mechanism 10 and second positioning mechanism 20 are determined based on reference substrate 81 by first positioning mechanism 10 and second positioning mechanism 20 in the state in which reference substrate 81 is disposed on vacuum chuck part 44. The determination of the reference position is performed according to the following process.

In first positioning mechanism 10, first driver 13 moves first reference part 11 in a direction toward rotating center 41 of rotating part 40 until first reference part 11 contacts reference substrate 81. In this case, first reference part 11 is rotated around pin 15, and contact surface 14 formed in a V-shape is adjusted to contact reference substrate 81 at two points. And, in that state, first reference part 11 and support part 12 are fixed by screw 16. The reference position of first positioning mechanism 10 is determined as a position where first reference part 11 contacts reference substrate 81 at two points in a direction toward rotating center 41 of rotating part 40. In addition, in second positioning mechanism 20, second reference part 21 moves in a direction toward rotating center 41 of rotating part 40 by second driver 23, and contact part 24 of second reference part 21 contacts with reference substrate 81. Then, second positioning mechanism 20 moves further until the distance up to movable part 25, which is determined by position sensor 28, becomes a predetermined reference distance, for example, 1 mm. The reference position of second positioning mechanism 20 is determined at a position where the distance up to movable part 25 becomes the predetermined reference distance. Thereafter, first positioning mechanism 10 moves first reference part 11 in a direction away from reference substrate 81 by first driver 13. Similarly, second positioning mechanism 20 moves second reference part 21 in a direction away from reference substrate 81 by second driver 23. Thereafter, reference substrate 81 is removed from the concave portion formed on vacuum chuck part 44.

Next, at S106, the information of the reference position is stored. Specifically, the reference position of first positioning mechanism 10 determined at S104 and the reference position of second positioning mechanism 20 are stored in storage unit 52 mounted in controller 50.

Next, at S108, substrate 30 is disposed on vacuum chuck part 44. Specifically, the nitrogen gas is supplied toward substrate 30 from vacuum chuck part 44 in a state in which substrate 30 is disposed on vacuum chuck part 44, and substrate 30 becomes floated over vacuum chuck part 44 by a nitrogen gas blower. Since the surface of substrate 30 facing vacuum chuck part 44 is planar, substrate 30 may be adsorbed onto vacuum chuck part 44 to be disposed thereon. In this state, in order to avoid the adsorption, the nitrogen gas blow may be performed. Therefore, substrate 30 may easily move over vacuum chuck part 44. For this reason, in this state, substrate 30 is not adsorbed onto vacuum chuck part 44. In addition, the nitrogen gas blow may be performed as needed and the positioning in the exemplary embodiment of the present disclosure may be performed without performing the nitrogen gas blow.

Next, at S110, the measurement of substrate 30 is performed. Specifically, first reference part 11 is moved to the reference position of first positioning mechanism 10, which is stored at S106, by first driver 13. In this case, when substrate 30 disposed on vacuum chuck part 44 is larger than 300 mm or the disposed position of substrate 30 on vacuum chuck part 44 is misaligned, the side of substrate 30 is contacted at contact surface 14 of first reference part 11. Substrate 30 is then pushed by first reference part 11 and is moved toward second positioning mechanism 20. Meanwhile, when substrate 30 disposed on vacuum chuck part 44 is smaller than 300 mm in a case where substrate 30 is disposed under the same condition as that of the reference substrate, a gap is normally formed between contact surface 14 of first reference part 11 and the side of substrate 30 while contact surface 14 of first reference part 11 and the side of substrate 30 are not being contacted with each other.

Next, second reference part 21 moves up to the reference position of second positioning mechanism 20, which is stored at S106, by second driver 23. At this time, contact part 24 of second reference part 21 contacts with the side surface of substrate 30, and contact part 24 is pushed in a direction away from rotation center 41. Movable part 25 moves in a direction away from rotating center 41 along with the pushed movement of contact part 24. When substrate 30 disposed in vacuum chuck part 44 is larger than 300 mm, the distance up to movable part 25 being detected by position sensor 28 becomes smaller than, for example, 1 mm which is a predetermined reference distance. Meanwhile, when substrate 30 disposed on vacuum chuck part 44 is smaller than 300 mm, the distance up to movable part 25 being detected by position sensor 28 becomes larger than, for example, 1 mm which is the predetermined reference distance. Thereafter, in each state, the distances up to movable part 25 being detected by position sensor 28 are transmitted to operator 53.

Next, at S112, the actual measured value of the diameter of substrate 30 is calculated in operator 53 mounted in controller 50 based on the distance up to movable part 25 detected by position sensor 28. Specifically, since the reference position is 1 mm that corresponds to a position where the distance up to movable part 25, when the distance detected by position sensor 28 is, for example, 0.8 mm, the diameter of substrate 30 is calculated as 300.2 mm. In addition, when the distance detected by position sensor 28 is, for example, 1.2 mm, the diameter of substrate 30 is calculated as 299.8 mm.

When second reference part 21 moves up to the predetermined position, there may be a case in which the detection value largely deviates from the stored value. As an example for this case, contact part 24 is contacted with a notch formed on the side of substrate 30. For this reason, in this case, since the measurement of substrate 30 is required to be performed so as to avoid the position in which the notch is formed, substrate 30 rotates by 90° by rotating part 40, and then the same measurement is performed again. When the detection value largely deviates from the stored value even after the measurement is performed several times, it can be considered that substrate 30 disposed on vacuum chuck part 44 does not satisfy the predetermined standard. In this case, substrate 30 may be removed from vacuum chuck part 44 and a next substrate may be disposed to be subjected to the process after S108.

Next, at S114, a correction value is calculated at operator 53 for aligning the center of substrate 30 with rotating center 41. That is, the correction value that corresponds to a distance to which substrate 30 disposed on vacuum chuck part 44 is moved from the current position is calculated based on the measured value of the diameter of substrate 30 calculated at S112. Specifically, at S112, when the diameter of substrate 30 is measured, for example, as 300.2 mm, since the diameter of substrate 30 becomes larger by 0.2 mm than that of reference substrate 81, the correction value becomes +0.1 mm that is a half of +0.2 mm. In addition, when the diameter of substrate 30 is measured, for example, as 299.8 mm, since the diameter of substrate 30 becomes smaller by 0.2 mm than that of reference substrate 81, the correction value becomes −0.1 mm that is a half of −0.2 mm.

Next, at S116, the information on the measured value and the correction value are transmitted to the substrate processing apparatus. Specifically, the information on the measured value and the correction value for the substrate are transmitted by transmitter 54 to, for example, nozzle driving controller 170 that performs the substrate processing in the substrate processing apparatus.

Next, at S118, driving controller 51 performs the position correction of substrate 30 disposed on vacuum chuck part 44 based on the correction value obtained S114. Specifically, when the correction value is +0.1 mm, since the center of substrate 30 deviates from by 0.1 mm toward second positioning mechanism 20 side rather than toward rotating center 41 of rotating part 40, driving controller 51 causes first driver 13 of first positioning mechanism to move first reference part 11 by 0.1 mm in a direction away from rotating center 41. Therefore, substrate 30 is pushed toward first positioning mechanism 10 side by spring part 26 of second reference part 21 through connecting part 29 and contact part 24, and the center of substrate 30 may coincide with rotating center 41. In addition, when the correction value is −0.1 mm, since the center of substrate 30 deviates from by 0.1 mm toward first positioning mechanism 10 side rather than toward rotating center 41 of rotating part 40, driving controller 51 causes first driver 13 of first positioning mechanism 10 to move first reference part 11 by 0.1 mm in a direction toward rotating center 41. Therefore, since the side of substrate 30 is pushed through contact surface 14 of first reference part 11, and spring part 26 of second positioning mechanism 20 is retracted, substrate 30 may move toward second positioning mechanism 20, such that the center of substrate 30 may coincide with rotating center 41.

Next, at S120, substrate 30 is adsorbed onto vacuum chuck part 44. Specifically, after the center of substrate 30 coincides with rotating center 41 of rotating part 40 at S118, the nitrogen gas blow stops and the evacuation is performed by, for example, the vacuum pump connected to vacuum chuck part 44, and substrate 30 is adsorbed onto vacuum chuck part 44 through opening part 45 which is provided on vacuum chuck part 44. Thereafter, first positioning mechanism 10 moves first reference part 11 in a direction away from rotating center 41 by first driver 13 such that contact surface 14 of first reference part 11 does not contact the side of substrate 30. Similarly, second positioning mechanism 20 moves second reference part 21 in a direction away from rotating center 41 by second driver 23, such that contact part 24 of second reference part 21 does not contact the side of substrate 30. Therefore, substrate 30 may be adsorbed onto vacuum chuck part 44 in a state in which the center of substrate 30 coincides with rotating center 41 of rotating part 40.

Substrate Processing Method

Next, at S122, a processing space is formed by separating drain cup 110 and top plate 120, and substrate 30 is rotated within the processing space. Substrate 30 is absorbed on the vacuum chuck part 44 and may rotate in the state where rotating center 41 coincides with the center of substrate 30.

Next, at S124, the processing of substrate 30 is performed. Specifically, the bevel processing of substrate 30 is performed by first nozzle 141 and second nozzle 161. With respect to first nozzle 141 and second nozzle 161, a nozzle position is set respectively in a position indented inwardly by processing width from the end of reference substrate 81. The bevel processing of substrate 30 is performed by adjusting the nozzle position from the predetermined nozzle position based on the measured value and the correction value of substrate 30 transmitted by transmitter 54. That is, nozzle driving controller 170 moves first nozzle 141 to a predetermined position by a motor working for nozzle 142, and moves second nozzle 161 to a predetermined position by a motor working for nozzle 162. Specifically, in the case that the processing width performing the processing of substrate 30 is 3 mm from the end of substrate 30, the nozzle position of first nozzle 141 is preset to a position inwardly from the end of reference substrate 81. Since the correction value of first positioning mechanism 10 is +0.1 mm when the measured diameter of substrate 30 is 300.2 mm, the end of substrate 30 is located outside the end of reference substrate 81 by 0.1 mm when the center of substrate 30 coincides with rotating center 41. For the reason, similar to first positioning mechanism 10, first nozzle 141 is moved in a direction away from rotating center 41 from the preset nozzle position. In addition, since the correction value of first positioning mechanism 10 is −0.1 mm when the measured diameter of substrate 30 is 299.8 mm, the end of substrate 30 is located inwardly by 0.1 mm from the end of reference substrate 81 toward rotating center 41 side when the center of substrate 30 coincides with rotating center 41. For the reason, similar to first positioning mechanism 10, first nozzle 141 is moved in a direction toward rotating center 41 from the preset nozzle position. Second nozzle 161, similar to first nozzle 141, is moved by the correction value of first positioning mechanism 10 from the preset nozzle position according to the processing width. Therefore, first nozzle 141 and second nozzle 161 may be accurately moved to a position spaced by the preset processing width from the end of substrate 30 and coincide with the processing width, regardless of the exact size of substrate 30. Thereafter, the bevel processing is performed by supplying a chemical liquid from first nozzle 141 and second nozzle 161.

Even in the case where the bevel processing of substrate 30 is performed by brush unit 150, a similar control may be performed to that of the nozzle position adjustment, brush part 151 may move so that a position in a horizontal direction with respect to substrate 30 becomes the desired position by first motor 154, based on the correction value obtained at S116. Therefore, the desired processing area may be performed accurately by brush part 151, regardless of the exact size of substrate 30.

After the bevel processing is completed, drain cup 110 and top plate 120 are separated from each other, substrate 30 having been subjected to the bevel processing is removed by releasing vacuum chuck part 44 and carried out by second wafer carrying mechanism 260. In addition, a new substrate 30 to be subjected to the bevel processing may be disposed on vacuum chuck part 44, which will be subjected to the process of S108 to S124 to perform the bevel processing.

As the substrate processing apparatus according to the exemplary embodiment of the present disclosure, there may be the apparatus for performing the bevel processing of the substrate, an apparatus for performing the processing from the center of the substrate toward the peripheral portions thereof, an apparatus for performing the processing from peripheral portions of the substrate toward the center thereof. The substrate processing method according to the exemplary embodiment of the present disclosure may be performed using these apparatuses.

Further, any substrate processing apparatus and substrate processing method may be used for the exemplary embodiment of the present disclosure, as long as the apparatus and method perform the process by rotating the substrate such as a wafer. In particular, if the center of the substrate does not coincide with the rotating center when the processing for a large substrate is performed, the desired rotation may not be made by the eccentricity and the desired processing may not be performed. The substrate processing apparatus and the substrate processing method according to the exemplary embodiment of the present disclosure may perform the desired processing even in these cases.

Furthermore, since the reference position detection process using reference substrate 81 needs to be performed once, processes from S108 to S124 may be repeated, such that an accurate positioning of the central position for a plurality of substrates may be performed, thereby performing the substrate processing over a short period of time.

Further, in the substrate processing system shown in FIGS. 1 and 2, when the information on the measured value and the correction value of the diameter of substrate 30 obtained from the above-mentioned substrate positioning apparatus that is located in a one (1) substrate processing unit may be transmitted to a mechanical control unit 213. And thereafter, when the same substrate processing is performed in other substrate processing units, the substrate processing such as the positioning or the adjustment of nozzle position may be performed using the transmitted information on the measured value and the correction value of the substrate.

Furthermore, separate from the substrate processing unit, a unit equipped with the substrate positioning apparatus may be installed, such that the information on the measured value and the correction value of the diameter of the substrate obtained by the substrate positioning apparatus may be transmitted to the substrate processing unit.

Figure 11:
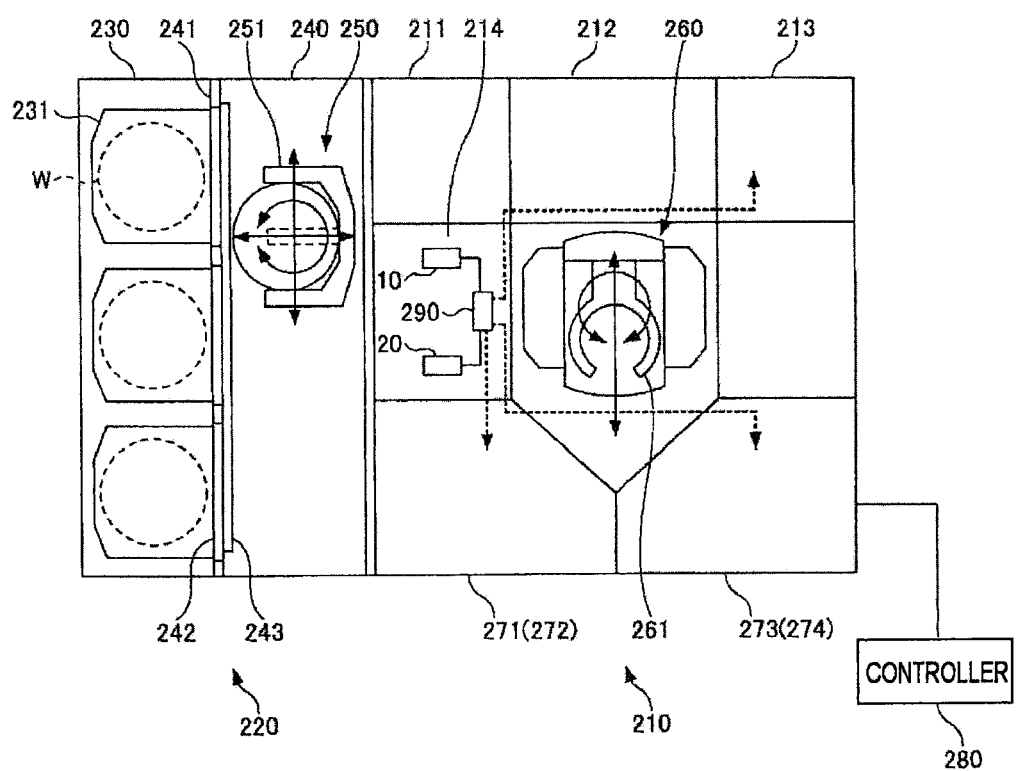
FIG. 11 is a configuration diagram of another substrate processing system according to the exemplary embodiment of the present disclosure.

Specifically, as shown in FIG. 11, the substrate positioning apparatus is mounted in, for example, wafer transfer unit 214 and the information on the measured value and the correction value of the substrate obtained by the substrate positioning apparatus are transmitted from a transmitter 290 to substrate processing units 271 to 274 performing the substrate processing. Therefore, in substrate processing units 271 to 274, the positioning that matches the center of the substrate with the rotating center, or the adjustment of the nozzle position when the substrate processing may be performed, based on the information on the measured value and the correction value which are transmitted. Further, when the information on the measured value and the correction value of the substrate obtained by the substrate positioning apparatus are transmitted to mechanical control unit 213 from transmitter 290, the information may be further transmitted from mechanical control unit 213 to substrate processing units 271 to 274.

As described above, the information on the measured value and the correction value of the substrate obtained by one (1) substrate positioning apparatus can be transmitted to other substrate processing units, and each of the other substrate processing units utilize the transmitted information. As a result, an accurate positioning of a substrate may be performed in each of the other substrate processing units without actually measuring the size of the substrates.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus, comprising:
a plurality of substrate processing units each configured to perform a substrate processing by supplying a processing liquid to a substrate disposed on a substrate disposing part;
a positioning mechanism provided in each of the plurality of substrate processing units and configured to contact a side of the substrate disposed on the substrate disposing part to determine a position of the substrate while the substrate is disposed on the substrate disposing part;
a positioning driver configured to drive the positioning mechanism;
a detector provided in each of the plurality of substrate processing units and configured to detect a position of the positioning mechanism while the substrate is disposed on the substrate disposing part;
a storage unit provided corresponding to the plurality of substrate processing units and configured to store a position of the positioning mechanism with respect to a reference substrate as a reference position;
an operator provided corresponding to the plurality of substrate processing units and configured to calculate a difference between the reference position of the positioning mechanism of each of the plurality of substrate processing units stored at the storage unit and a detected position of the positioning mechanism detected in the detector of each of the plurality of substrate processing units while the substrate is disposed on the substrate disposing part of each of the plurality of substrate processing units, and configured to calculate a diameter of the substrate and a correction value based on the difference between the reference position of the positioning mechanism stored at the storage unit and the detected position of the positioning mechanism;
a transmitter provided corresponding to the plurality of substrate processing units and configured to transmit the diameter of the substrate and the correction value calculated in the operator to the substrate processing unit after the operator calculates the diameter of the substrate and the correction value;
and a positioning driving controller provided corresponding to the plurality of substrate processing units and configured to receive the diameter of the substrate and the correction value transmitted from the transmitter in order to move the substrate by controlling the positioning driver such that a center of the substrate coincides with a center of the substrate disposing part,
wherein each of the plurality of substrate processing units further comprises:
a nozzle configured to supply the processing liquid to the substrate;
a nozzle driver configured to move the nozzle along a surface of the substrate;
and a nozzle driving controller programmed and configured to receive the diameter of the substrate and the correction value transmitted from the transmitter and move the nozzle to a predetermined position based on the diameter of the substrate and the correction value received by controlling the nozzle driver such that the nozzle is fixed to the predetermined position from a periphery area of the substrate before the substrate processing begins,
wherein each of the plurality of substrate processing units performs the substrate processing by discharging the processing liquid from the nozzle to the substrate while the position of the nozzle is being fixed to the predetermined position from the periphery area of the substrate being rotated on the substrate disposing part with the center of the substrate coincides with the center of the substrate disposing part.

2. The substrate processing apparatus of claim 1, wherein the transmitter transmits the diameter of the substrate and the correction value to the plurality of substrate processing units.

3. The substrate processing apparatus of claim 1, wherein the nozzle is configured to move from the central portion of the substrate to the peripheral portions thereof, or from the peripheral portion of the substrate to the central portion thereof.

4. The substrate processing apparatus of claim 1, wherein the positioning mechanism further comprises:
a first positioning mechanism including a first reference part that contacts the one side of the substrate and a first driver that moves the first reference part;
a second positioning mechanism including a second reference part that contacts the other side of the substrate and a second driver that moves the second reference part; and
a controller configured to control the first driver and the second driver,
wherein the second reference part includes an elastic part, and a movable part that moves with the expansion or contraction of the elastic part, such that when a reference substrate is centered on the substrate disposing part, the first driver moves the first positioning mechanism to a first reference position such that the first reference part contacts the first location on the peripheral side of the reference substrate, then the second driver moves the second positioning mechanism to a second reference position such that the second reference part is compressed such that it applies a force to the reference substrate in a direction of the first driver, with a distance between the detector and the movable part establishing a predetermined reference distance,
wherein the controller is configured to:
control the first driver to move the first positioning mechanism to the first reference position, afterward to control the second driver to move the second positioning mechanism to the second reference position, afterward to receive from the detector the distance between the detector and the movable part and to calculate the deviation amount by subtracting that distance from the predetermined reference distance;
afterward, if the deviation amount is within a predetermined tolerance and positive, indicating the substrate being processed has a diameter smaller than the reference substrate, directing the first driver to move the first positioning mechanism further toward the center of the substrate disposing part by half the deviation amount, and if the deviation amount is within a predetermined tolerance and negative, indicating the substrate being processed has a diameter larger than the reference substrate, directing the first driver to move the first positioning mechanism away from the center of the substrate disposing part by half the deviation amount.

5. The substrate processing apparatus of claim 4, wherein the first reference part is formed to contact the one side of the substrate at two or more points.

6. The substrate processing apparatus of claim 4, wherein the second reference part further comprises a contact part that contacts the other side of the substrate at one point and an elastic part that applies force to the contact part in a moving direction of the second reference part.

7. The substrate processing apparatus of claim 6, wherein the contact part has a substantially circular shape and is mounted in the second reference part in a rotatable state around the center of the circular shape as an axis.

8. The substrate processing apparatus of claim 1, wherein the nozzle is configured to move in a radial direction of the substrate and to be disposed at a position on the substrate based on the diameter of the substrate.

9. A substrate processing method that performs a substrate processing by supplying a processing liquid from a nozzle to a substrate, the method comprising:

providing a substrate processing unit and a positioning mechanism as a single unit;

storing a position of the positioning mechanism with respect to a reference substrate as a reference position of the positioning mechanism in a storage unit;

disposing the substrate on a substrate disposing part of the substrate processing unit;

detecting a position of the positioning mechanism by a detector by contacting the substrate with the positioning mechanism while the substrate is disposed on the substrate disposing part;

calculating a difference between the reference position of the positioning mechanism and the detected position of the positioning mechanism while the substrate is disposed on the substrate disposing part, and calculating a diameter of the substrate and a correction value based on the difference between the reference position of the positioning mechanism stored at the storing and the detected position of the positioning mechanism;

after the calculating the diameter of the substrate and the correction value, transmitting the diameter of the substrate and the correction value to a driving controller of the substrate processing unit;

after the transmitting, moving the substrate such that a center of the substrate coincides with a center of the substrate disposing part based on the diameter of the substrate and the correction value and after the moving the substrate, moving a nozzle to a bevel part of the substrate based on the diameter of the substrate and the correction value transmitted at the transmitting such that the nozzle is fixed to the bevel part of the substrate before a bevel processing of the substrate is performed within the single unit;

wherein the bevel processing is performed within the single unit by discharging the processing liquid from the nozzle to the substrate after the position of the nozzle is fixed to the bevel part of the substrate being rotated on the substrate disposing part with the center of the substrate coincides with the center of the substrate disposing part.

10. The substrate processing method of claim 9, wherein the storing the position of the positioning mechanism for the reference substrate further comprising:

disposing the reference substrate on the substrate disposing part so that the center of the reference substrate coincides with the center of the substrate disposing part;

determining the reference position information of the positioning mechanism by contacting a first reference part with a one side of the reference substrate and contacting a second reference part with an other side of the reference substrate; and storing the reference position information as the information for the reference substrate.

11. The substrate processing method of claim 9, wherein the detecting detects the position of a second reference part by a detector by contacting a first reference part with a one side of the substrate and contacting a second reference part with an other side of the substrate.

12. The substrate processing method of claim 9, wherein the positioning of a plurality of processed substrates is performed by repeatedly performing the disposing, the detecting, and the calculating for each of the plurality of substrates to be processed.

13. The substrate processing method of claim 9, further comprising moving the nozzle in a radial direction of the substrate to be disposed at a position on the substrate based on the diameter of the substrate.

14. A non-transitory computer readable storage medium recording programs for executing the substrate processing method claimed in claim 9 in a computer.

* * * * *